(12) United States Patent
Perkins et al.

(10) Patent No.: US 10,032,690 B2
(45) Date of Patent: Jul. 24, 2018

(54) SEMICONDUCTOR STRUCTURE INCLUDING A THERMALLY CONDUCTIVE, ELECTRICALLY INSULATING LAYER

(71) Applicant: Avago Technologies General IP (Singapore) Pte. Ltd., Singapore (SG)

(72) Inventors: Nathan Perkins, Windsor, CO (US); Thomas Dungan, Fort Collins, CO (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 0 days.

(21) Appl. No.: 14/630,562

(22) Filed: Feb. 24, 2015

(65) Prior Publication Data

US 2016/0247745 A1    Aug. 25, 2016

(51) Int. Cl.
| | | |
|---|---|---|
| *H01L 21/308* | (2006.01) | |
| *H01L 23/373* | (2006.01) | |
| *H01L 29/10* | (2006.01) | |
| *H01L 29/08* | (2006.01) | |
| *H01L 29/423* | (2006.01) | |
| *H01L 29/737* | (2006.01) | |
| *H01L 29/417* | (2006.01) | |
| *H01L 29/205* | (2006.01) | |
| *H01L 23/31* | (2006.01) | |
| H01L 23/367 | (2006.01) | |
| H01L 29/808 | (2006.01) | |
| H01L 29/812 | (2006.01) | |

(52) U.S. Cl.
CPC ...... *H01L 23/3731* (2013.01); *H01L 23/3185* (2013.01); *H01L 29/0813* (2013.01); *H01L 29/0817* (2013.01); *H01L 29/0821* (2013.01); *H01L 29/1004* (2013.01); *H01L 29/1029* (2013.01); *H01L 29/205* (2013.01); *H01L 29/41708* (2013.01); *H01L 29/41725* (2013.01); *H01L 29/42304* (2013.01); *H01L 29/42316* (2013.01); *H01L 29/7371* (2013.01); *H01L 23/367* (2013.01); *H01L 29/808* (2013.01); *H01L 29/812* (2013.01)

(58) Field of Classification Search
None
See application file for complete search history.

(56) References Cited

U.S. PATENT DOCUMENTS

| | | | |
|---|---|---|---|
| 5,719,433 A | | 2/1998 | Delage et al. |
| 7,241,699 B2 | * | 7/2007 | Van Zeghbroeck ........ H01L 21/0445 257/E21.054 |
| 7,449,729 B2 | * | 11/2008 | Miyajima ......... H01L 29/66318 257/197 |
| 7,576,409 B1 | | 8/2009 | Chen et al. |
| 8,330,556 B2 | | 12/2012 | Miller et al. |

(Continued)

FOREIGN PATENT DOCUMENTS

CN    201007993 Y    1/2008

OTHER PUBLICATIONS

Yanagitani et al (2008 IEEE international Ultrasonics Symposium Preoceedings, pp. 90-93).*

(Continued)

*Primary Examiner* — Ali Naraghi

(57) ABSTRACT

A thermally conductive and electrically insulating layer is provided over a semiconductor structure.

24 Claims, 6 Drawing Sheets

(56) References Cited

U.S. PATENT DOCUMENTS

| | | | |
|---|---|---|---|
| 2004/0195597 A1* | 10/2004 | Torvik | H01L 29/1608 257/232 |
| 2005/0199909 A1* | 9/2005 | Murayama | H01L 29/0817 257/197 |
| 2010/0090250 A1* | 4/2010 | Murata | H01L 23/367 257/192 |
| 2011/0121689 A1 | 5/2011 | Grannen et al. | |
| 2011/0180391 A1 | 7/2011 | Larson, III et al. | |
| 2012/0096697 A1 | 4/2012 | Grannen et al. | |
| 2012/0218060 A1 | 8/2012 | Burak et al. | |
| 2014/0110761 A1 | 4/2014 | Yang et al. | |
| 2014/0292150 A1 | 10/2014 | Zou et al. | |

OTHER PUBLICATIONS

Polytronics Corporation, "Thermal Conductive Board."
Machine Translation of CN201007993Y.

* cited by examiner

SEMICONDUCTOR STRUCTURE INCLUDING A THERMALLY CONDUCTIVE, ELECTRICALLY INSULATING LAYER

BACKGROUND

Modern mobile wireless power amplifiers are typically constructed as an integrated circuit, employing a variety of active transistors and passive components. Presently, the prevalent technologies for such integrated circuits are based on heterojunction bipolar transistors (HBT) devices, especially those derived from GaAs, AlAs, InAs, InP, or various alloys thereof. Such circuits are often utilized as a component in a larger integrated product and may include RF switching and filtering functions and matching networks. These integrated products are designed to amplify an input low power RF signal, and output a high power modulated signal that is suitable for wireless transmission over distance.

Heat dissipation is becoming an increasingly important issue for mobile power amplifiers. Especially of concern in this area are the transistors, generally HBTs, upon which the amplifier integrated circuit is based. Notably, product reliability may be limited not only by the maximum junction temperature for the transistors, but also by local thermal nonuniformities along the transistor dimensions. In the first case, operation of the circuit at a junction temperature in excess of the device rating leads to reliability failure in the transistor junctions, contacts, and metallizations. In the second case, operation of the transistor in a condition of thermal nonuniformity may lead to localized reduction of the transistor turnon voltage, which in turn may lead to a runaway condition in which the transistor catastrophically fails at the hot spot. Further exacerbating the requirements for thermal dissipation and uniformity, recently the industry trend is to reduce the power amplifier die and package sizes. Smaller power amplifier die and amplifier packages are desirable for both cost and form factor reasons. For example, in thin and compact modern wireless handsets, smaller form factors are desired. However, the decreasing die and package size increases the thermal power density on the die and the package, and may also increase the local thermal nonuniformity of the transistors. These factors further increase the need to dissipate the heat generated at the device level.

What is needed, therefore, is a semiconductor structure that overcomes at least the shortcomings described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
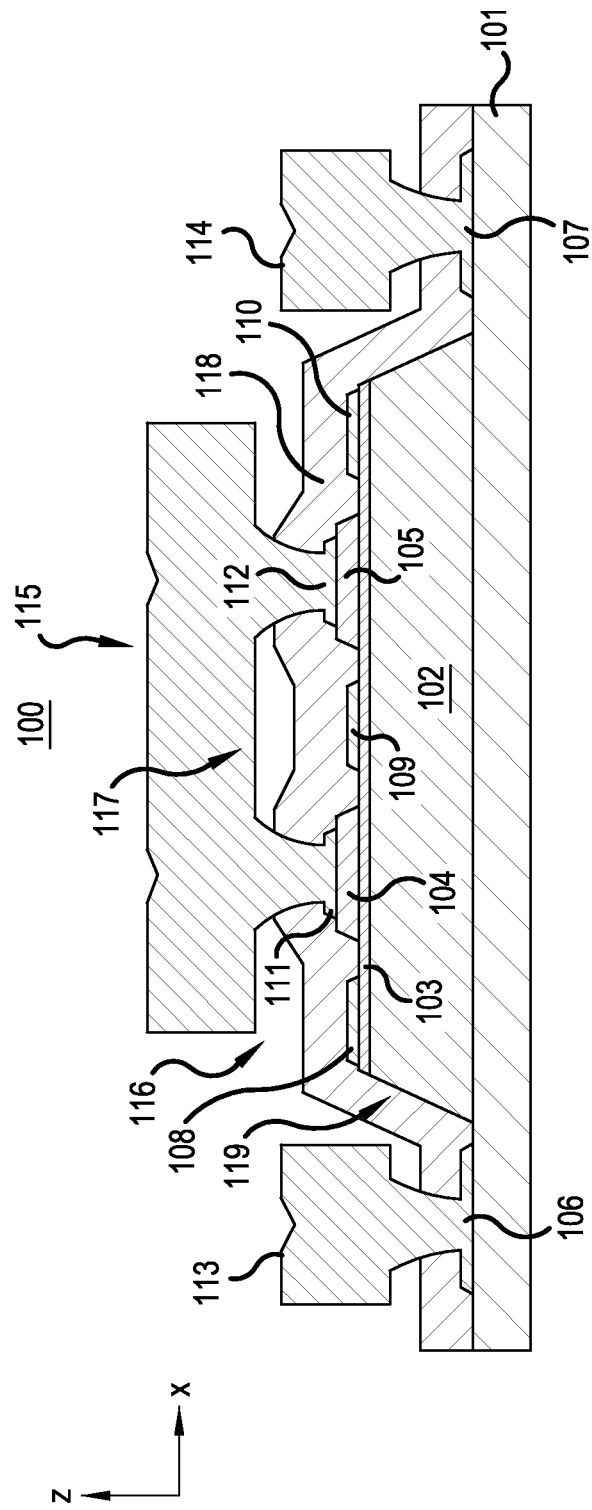
FIG. 1 shows a cross-sectional view of a portion of a semiconductor structure in accordance with a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known semiconductor structures and methods may be omitted so as to not obscure the description of the representative embodiments. Such methods and semiconductor structures are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

Unless otherwise noted to the contrary below, when a first element (e.g., electrical component, or circuit) is said to be connected or coupled to a second element, this encompasses cases where one or more intermediate element may be employed to connect the two devices to each other. In contrast, when a first element is said to be directly connected or directly coupled to a second element, this encompasses cases where the two elements are connected together without any intervening element except any necessary electrical traces.

In accordance with another representative embodiment, a semiconductor structure comprises: a layer disposed over a side of a substrate; a first electrical contact layer disposed over the layer; a second electrical contact disposed over the same side of the substrate; and a thermally conductive and electrically insulating layer comprising polycrystalline aluminum nitride (AlN) or highly textured AlN disposed over a portion of the layer and between the first electrical contact and the second electrical contact.

FIG. 1 shows a cross-sectional view of a semiconductor structure 100 in accordance with a representative embodiment. In the depicted representative embodiment 100, the semiconductor structure 100 illustratively comprises power transistors and power amplifiers that are contemplated for use in radio frequency (RF), microwave and millimeter wave applications. In a representative embodiment, the semiconductor structure 100 comprises a heterojunction bipolar transistor (HBT). It is emphasized that this is merely illustrative, and other semiconductor devices are contemplated by the present teachings. More generally, the semiconductor structure 100 comprises bipolar transistors, single HBTs, or dual HBTs. Alternatively, the semiconductor structure 100 may comprise pseudomorphic high electron mobility transistors (pHEMTs), HEMTs, metal-semiconductor field effect transistors (MESFETs), or other junction gate field effect transistors (JFETs) known to those of ordinary skill in the art.

In accordance with certain representative embodiments, the semiconductor devices of semiconductor structure 100 are made of binary semiconductor materials including Group III-V semiconductor materials, such as GaAs, InP, AlAs, GaN, AlN, InN, and alloys of these semiconductor materials. Alternatively, the semiconductor structure 100 comprises semiconductor devices made of Group IV semiconductor materials, ternary semiconductor materials, silicon (Si), silicon-germanium (SiGe), and alloys of some of these semiconductor materials. Essentially, and as will become clearer as the present description continues, the present teachings are contemplated for use when it is beneficial to distribute and/or remove the heat generated by the various components of the semiconductor structure 100 with improved efficiency compared to known semiconductor structures. As such, and more generally, the present teachings are applicable more broadly to a variety of electronic and optoelectronic devices.

The semiconductor structure 100 comprises a subcollector layer 101. A collector layer 102 is disposed over the subcollector layer 101, and a base layer 103 is disposed over the collector layer 102. Finally, a first emitter layer 104 and a second emitter layer 105 are disposed over the base layer 103. The collector layer 102, the base layer 103 and the first and second emitter layers 104, 105 are formed using known materials and methods, including selective doping and epitaxial growth techniques. Illustratively, in a region over a surface of the base layer 103, a comparatively thin layer of comparatively wide bandgap material (e.g., InGaP) is provided in order to improve electrical reliability; and the first and second emitter layers 104, 105 each comprise a comparatively wide bandgap material (e.g., InGaP, or AlGaAs).

It is emphasized that the depiction in FIG. 1 is a portion of semiconductor structure 100, and the configuration is merely illustrative. Notably, many additional emitter, base and collector layers are contemplated. Moreover, the depicted configuration of (C)ollector-(B)ase-(E)mitter is also merely illustrative, and other configurations within the purview of one of ordinary skill in the art are contemplated by the present teachings. For example, so-called single-emitter (e.g., CBEBC) configurations, and so-called emitter-outside configurations (e.g., CEBEC), as well as others, are contemplated. Alteration of the present teachings to accommodate such structures will become readily apparent to one of ordinary skill in the art upon review of the present disclosure.

First and second ohmic collector contacts ("collector contacts") 106, 107 are selectively provided over the subcollector layer 101. First, second and third ohmic base contacts ("base contacts") 108, 109 and 110 are selectively provided over the base layer 103. Finally, first and second emitter ohmic contacts ("emitter contacts") 111, 112 are selectively provided over the first and second emitter layers 104, 105, respectively. The various ohmic contacts generally comprise any of the materials and alloys Ti, Pt, TiW, AuGe, AuGeNi, typically with Au overlayers to reduce electrical resistance, and are formed by known methods.

The first-third base contacts 108-110 and the first and second emitter contacts 111, 112 are interdigitated as depicted with a contact to contact spacing of approximately 1 μm or less.

A first electrical interconnect 113 is connected to the first collector contact 106, and a second electrical interconnect 114 is connected to the second collector 107. A third electrical interconnect 115 is connected to the first and second emitter contacts 111, 112, and a gap 116 exists between a lower surface 117 of the third interconnect and a thermally conductive and electrically insulating layer 118. As is known, the gap 116 is provided to reduce the coupling capacitance between the third electrical interconnect 115 and other unassociated electrical nodes (e.g., first-third base contacts 108-110). The gap 116 typically comprises air or an interlayer dielectric (not shown), such as benzocyclobutene (BCB), polyimide, or polybenzoxazole (PBO).

As depicted in FIG. 1, the thermally conductive and electrically insulating layer 118 is provided over the subcollector layer 101 and substantially surrounds the exposed portions of: the collector layer 102; the base layer 103; and first and second emitter layers 104; 105. The thermally conductive and electrically insulating layer 118 may also substantially surround first and second collector contacts 106, 107; first, second and third base contacts 108, 109 and 110; first and second electrical interconnects 113, 114; and a portion of a third electrical interconnect 115.

In accordance with a representative embodiment, the thermally conductive and electrically insulating layer 118 comprises aluminum nitride (AlN). Illustratively, the AlN is a polycrystalline AlN, which is sometimes referred to as "highly-textured" AlN. Alternatively, the thermally conductive and electrically insulating layer 118 may comprise other materials having an improved thermal conductivity compared to known passivation layers used in semiconductor applications. Contemplated materials include, but are not limited to diamond-like carbon (DLC), or boron nitride (BN), or silicon carbide (SiC), which are formed by known methods. Notably, in a representative embodiment, a comparatively thin layer (e.g., 0.1 μm or less) of a known dielectric material (e.g., SiN or SiOx deposited by plasma enhanced chemical vapor deposition (PECVD)), may be used as a barrier between the thermally conductive and electrically insulating layer 118 and the first and second collector contacts 106, 107; first, second and third base contacts 108, 109 and 110; first and second electrical interconnects 113, 114; and the third electrical interconnect 115. Alternatively, the comparatively thin layer (e.g., 0.1 μm or less) of a known dielectric material can be provided over the thermally conductive and electrically insulating layer 118, for example to provide a sealing function, such as to provide stability in environmental testing. As will be appreciated by one of ordinary skill in the art having the benefit of the present disclosure, inclusion of a layer of a known dielectric in addition to the thermally conductive and electrically insulating layer 118 will have not deleterious impact on the thermal dissipation of the semiconductor structure 100 provided by the present teachings, or add significantly to the parasitic capacitance of the semiconductor structure 100.

The thermally conductive and electrically insulating layer 118 comprising AlN is formed over the various surfaces of the so-called "front" end of the semiconductor structure 100 using one of a number of known physical vapor deposition (PVD) methods such as reactive sputtering deposition techniques, or plasma enhanced chemical vapor deposition (PECVD). Generally, the thermally conductive and electrically insulating layer 118 comprising AlN (or other materials) is deposited conformally. Illustrative reactive sputtering techniques include radio frequency (RF) sputtering of an aluminum target in a nitrogen atmosphere. Moreover, the thermally conductive and electrically insulating layer 118 comprising AlN can be fabricated following the teaching of one or more of the following commonly owned U.S. Patent Application Publications: 20140292150, 20120218060, 20110121689, 20120096697, and 20110180391, the entire disclosures of which are specifically incorporated herein by reference.

In accordance with representative embodiments described herein, the thickness of the thermally conductive and electrically insulating layer 118 comprising AlN is in the range of approximately 0.1 μm to approximately 2.0 μm.

Beneficially, the thermally conductive and electrically insulating layer 118 has an improved thermal conductivity compared to known materials used for passivation in semiconductor structures. Table 1 shows a comparison of various materials used in semiconductor structures:

TABLE 1

Thermal conductivity of selected materials

| Material | Thermal Conductivity (W/m-K) |
|---|---|
| GaAs | 55 |
| InGaP | 5 |
| SiN (PECVD) | 16-33 |
| AlN (PECVD) | 70-210 |
| Au | 320 |

As can be readily appreciated, the AlN material provided a significantly higher thermal conductivity than all materials in Table 1, with the exception of gold (Au), which is not electrically insulating. Notably, the greater the deposition quality of the AlN material, the higher the thermal conductivity. For example, the thermal conductivity of single-crystal AlN is approximately 319 W/m-K. As such, while the thermal conductivity (70 W/m-K) of AlN nitride that is substantially amorphous is over twice that of SiN, which is commonly used for the passivation layer of many known semiconductor structures, it is clearly beneficial to form the thermally conductive and electrically insulating layer 118 comprising AlN having defined crystalline structures, such as a polycrystalline (highly textured) AlN, which exhibits a thermal conductivity (210 W/m-K) that is more than six (6) times that of SiN.

As noted above, the thermally conductive and electrically insulating layer 118 is provided over the subcollector layer 101 and substantially surrounds the exposed portions of: the collector layer 102; the base layer 103; and first and second emitter layers 104, 105. The thermally conductive and electrically insulating layer 118 may also substantially surround first and second collector contacts 106, 107; first, second and third base contacts 108,109 and 110; first and second electrical interconnects 113, 114; and a portion of third electrical interconnect 115. As such, the thermally conductive and electrically insulating layer 118 is illustratively disposed over exposed sidewalls 119 of the collector layer 102. By selecting a material having a comparatively high thermal conductivity, such as AlN, and providing the thermally conductive and electrically insulating layer 118 over various exposed portions of the components of the front-end of the semiconductor structure, improvements in heat dissipation are realized compared to known semiconductor structures. For example, by providing the thermally conductive and electrically insulating layer 118 over the exposed portions of the base layer 103 and the first and second emitter layers 104, 105, and thus the entire "emitter-base region," the thermally conductive and electrically insulating layer 118 acts as a thermal equalization layer for the regions around the base layer 103 and the first and second emitter layers 104, 105 of the semiconductor structure 100. Among other benefits, this fosters thermal equilibrium of the junction temperature of the emitter-base junction(s) of the semiconductor structure 100, which makes the device more resistant to failure caused by thermal runaway. Moreover, the thermally conductive and electrically insulating layer 118 provided over the sidewalls 119 of the collector layer 102 acts as a thermal equalization layer between the emitter-base mesa and first and second collector contacts 106, 107, promoting lateral (x-direction of the coordinate system of FIG. 1) thermal transport. Beneficially, this fosters thermal equilibrium between the emitter-base mesa and first and second collector contacts 106, 107. Furthermore, extending the thermally conductive and electrically insulating layer 118 over exposed sidewalls 120 of the base layer 103 also fosters thermal equilibrium of the junction temperature of the emitter-base junction(s) of the semiconductor structure 100, and improves the overall heat transport from the various layers that comprise the active device (in this case HBT).

In known semiconductor structures, a common solution for the issue of thermal nonuniformity is to employ a metal film (not shown), usually connected to the emitter contact, but extending over the base contacts. To avoid shorting the emitter and base contacts, a comparatively thin dielectric layer is provided over the base contacts. Moreover, in such known structures the dielectric layer (sometimes referred to as a passivation layer) is provided over the various components of the semiconductor structure to protect the semiconductor structure from moisture ingress. Illustratively in known III-V HBTs, the dielectric layer is often SiN because it forms a comparatively chemically and electrically stable bond structure with less electrical surface state pinning (i.e., has a better passivation state to the underlying III-V material of the HBT). Alternatively, the dielectric layer of known III-V HBTs comprises a $SiN/SiO_2$ or SiN/SiON stack. Because these known dielectric materials used for this dielectric layer have comparatively poor thermal conductivity, a comparatively thin dielectric layer is provided to improve the heat conduction and thus heat dissipation.

However, as can be appreciated, a thin electrically insulating dielectric layer increases the extrinsic capacitance and increases the likelihood of electrical shorts in the structure. To this end, the capacitance (C) between two parallel plates is $C = \in_r * \in_o * A/t$; where $\in_r$ is the relative static permittivity; $\in_o$ is the relative permittivity in free space; A=the area of the two plates; t=the thickness of the dielectric between the plates. So, for any given material the capacitance is minimized when the dielectric thickness is increased. On the other hand, considering any given dielectric material, an increase in the thickness of the dielectric also directly hurts the heat conduction. This tradeoff always exists for any given dielectric material.

Beneficially, however, the present teachings foster improved thermal conductivity compared to known passivation layers, while at least maintaining the parasitic capacitance. Specifically, the dielectric constant of the materials contemplated for the thermally conductive and electrically insulating layer 118 are comparable to those used for the passivation layer in known semiconductor structures. Notably, while the dielectric constant for a material can depend on its deposition method, the dielectric constant for known passivation layers (approximately 4.0 (e.g., $SiO_2$) to the approximately 7.0) is approximately the same as that of AlN, depending again on the deposition conditions of its formation. As such, by using a material having a comparatively high thermal conductivity for the thermally conductive and electrically insulating layer 118, a shift in the tradeoff between extrinsic capacitance and heat conduction to a new and more favorable point compared to known semiconductor structures is realized. In particular, because the thermal resistance increases with increased thickness of a material, by selecting a comparatively thin (i.e., having a thickness substantially the same as that of a known passivation layer, such as SiN) thermally conductive and electrically insulating layer 118 comprising a material having a comparatively high thermal conductivity, the thermal conductivity is substantially improved, allowing for improved heat dissipation on the front-end of the semiconductor structure 100. In this example, therefore, although the parasitic capacitance is substantially the same as in the known semiconductor structure, the heat dissipation in semiconductor structure 100 is greatly improved. Alternatively, the thickness of the thermally conductive and electrically insulating layer 118 comprising a material having a comparatively high thermal conductivity could be deposited at a thickness that is great compared to that of a known passivation layer, such as SiN. As can be appreciated, this would increase the thermal resistance, but reduce the parasitic capacitance. In this example, therefore, although the heat dissipation in the front-end of the semiconductor structure 100 is substantially the same as that of a known semiconductor structure, the parasitic capacitance is substantially reduced.

Figure 2:
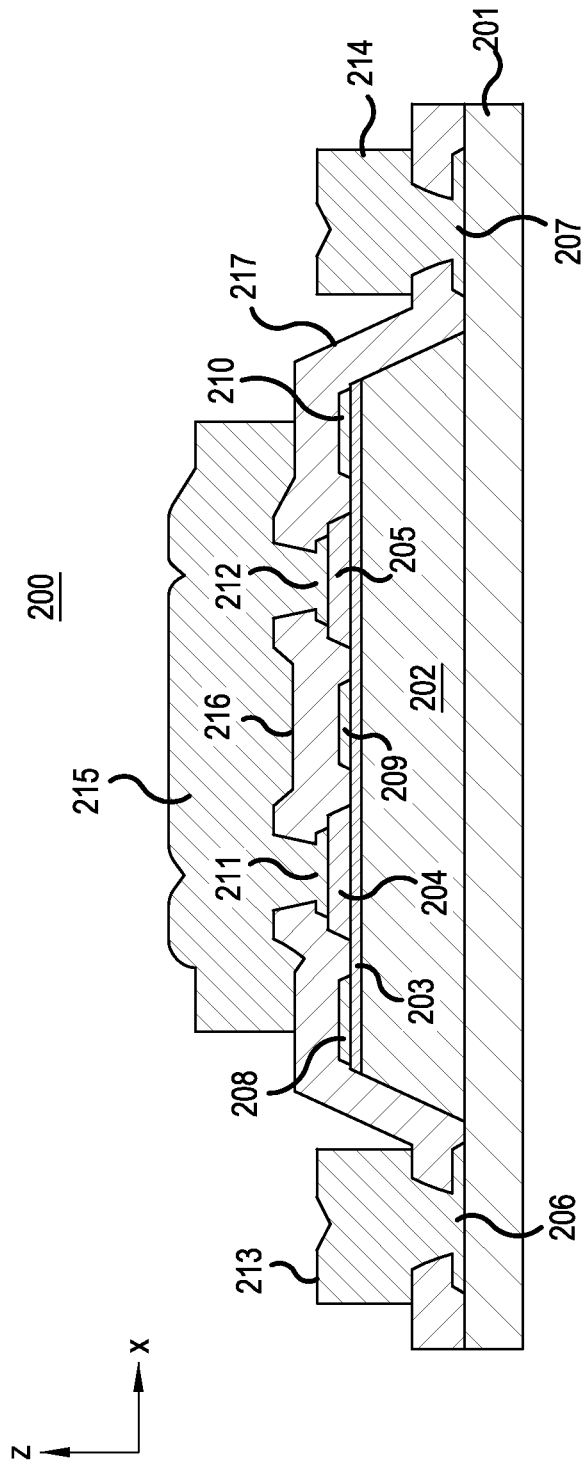
FIG. 2 shows a cross-sectional view of a portion of a semiconductor structure in accordance with a representative embodiment.

FIG. 2 shows a cross-sectional view of a semiconductor structure 200 in accordance with a representative embodiment. Many aspects and details of the semiconductor structure 200, which include illustrative materials, structures, methods of fabrication and dimensions, are substantively identical to those described above in connection with the description of semiconductor structure 100 presented above. Often, these common aspects and details are not repeated in order to avoid obscuring the presently described representative embodiments.

In the depicted representative embodiment, the semiconductor structure 200 illustratively comprises power transistors and power amplifiers that are contemplated for use in radio frequency (RF), microwave and millimeter wave applications. In a representative embodiment, the semiconductor structure 200 comprises a heterojunction bipolar transistor (HBT). It is emphasized that this is merely illustrative, and other semiconductor devices are contemplated by the present teachings. More generally, the semiconductor structure 200 comprises bipolar transistors, single HBTs, or dual HBTs. Alternatively, the semiconductor structure 200 may comprise pseudomorphic high electron mobility transistors (pHEMTs), HEMTs, metal-semiconductor field effect transistors (MESFETs), or other junction gate field effect transistors (JFETs) known to those of ordinary skill in the art.

In accordance with certain representative embodiments, the semiconductor devices of semiconductor structure 200 comprise binary semiconductor materials including Group III-V semiconductor materials, such as GaAs, InP, AlAs, GaN, AlN, InN, and alloys of these semiconductor materials. Alternatively, the semiconductor structure 200 comprises semiconductor devices made of Group IV semiconductor materials, ternary semiconductor materials, silicon (Si), silicon-germanium (SiGe), and alloys of some of these semiconductor materials. Essentially, and as will become clearer as the present description continues, the present teachings are contemplated for use when it is beneficial to remove heat generated by the various components of the semiconductor structure 200 with improved efficiency compared to known semiconductor structures. As such, and more generally, the present teachings are applicable more broadly to a variety of electronic and optoelectronic devices.

The semiconductor structure 200 comprises a subcollector layer 201. A collector layer 202 is disposed over the subcollector layer 201, and a base layer 203 is disposed over the collector layer 202. Finally, a first emitter layer 204 and a second emitter layer 205 are disposed over the base layer 203. The collector layer 202, the base layer 203 and the first and second emitter layers 204, 205 are formed using known materials and methods, including selective doping and epitaxial growth techniques. Illustratively, in a region over a surface of the base layer 203, a comparatively thin layer of comparatively wide bandgap material (e.g., InGaP) is provided in order to improve electrical reliability; and the first and second emitter layers 204, 205 each comprise a comparatively wide bandgap material (e.g., InGaP, or AlGaAs).

First and second ohmic collector contacts ("collector contacts") 206, 207 are selectively provided over the subcollector layer 201. First, second and third ohmic base contacts ("base contacts") 208, 209 and 210 are selectively provided over the base layer 203. Finally, first and second emitter ohmic contacts ("emitter contacts") 211, 212 are selectively provided over the first and second emitter layers 204, 205, respectively. The various ohmic contacts generally comprise gold (Au) and are formed by known methods. The various ohmic contacts generally comprise any of the materials and alloys Ti, Pt, TiW, AuGe, AuGeNi, typically with Au overlayers to reduce electrical resistance, and are formed by known methods.

The first~third base contacts 208-210 and the first and second emitter contacts 211, 212 are interdigitated as depicted with a contact-contact spacing of approximately 1 μm or less.

A first electrical interconnect 213 is connected to the first collector contact 206, and a second electrical interconnect 214 is connected to the second collector 207. A third electrical interconnect 215 is connected to the first and second emitter contacts 211, 212.

A thermally conductive and electrically insulating layer 217 is disposed over the front-end of the semiconductor structure 200, as described more fully below. Notably, and in stark contrast to semiconductor structure 100, the thermally conductive and electrically insulating layer 217 is applied at a thickness at least great enough so that its upper surface contacts a lower surface 216 of the third electrical interconnect 215. As such, there is no gap (e.g., gap 116 of FIG. 1) between the lower surface 216 of the third electrical interconnect 215 and its associated electrical nodes (e.g., first and second emitter contacts 111, 112) and other unassociated electrical nodes on the front-end of the semiconductor structure 200. The elimination of the gap from the semiconductor structure 200 beneficially provides an uninterrupted thermal path from the various components (e.g., base layer 203, and first and second emitter layers 204, 205) of the front-end of the semiconductor structure 200 through the thermally conductive and electrically insulating layer 217 to the third electrical interconnect 215, albeit at the expense of increased parasitic capacitances. However, as noted above, and as described more fully below, a shift in the tradeoff between extrinsic capacitance and heat conduction to a new and more favorable point is realized by the use of the thermally conductive and electrically insulating layer 217 of representative embodiments. Ultimately, an improved parasitic capacitance for a given thermal conductivity, or an improved thermal conductivity for a given parasitic capacitance is realized by the present teachings compared to known semiconductor structures.

As depicted in FIG. 2, the thermally conductive and electrically insulating layer 217 is provided over the subcollector layer 201 and substantially surrounds the exposed portions of: the collector layer 202; the base layer 203; and first and second emitter layers 204, 205. The thermally conductive and electrically insulating layer 217 may also substantially surround first and second collector contacts 206, 207; first, second and third base contacts 208, 209 and 210; first and second electrical interconnects 213, 214; and a portion of third electrical interconnect 215. As noted above, in a representative embodiment, a comparatively thin layer (e.g., 0.1 µm or less) of a known dielectric material (e.g., PECVD SiN or PECVD $SiO_x$), may be used as a barrier between the thermally conductive and electrically insulating layer 217 and the first and second collector contacts 206, 207; first, second and third base contacts 208, 209 and 210; first and second electrical interconnects 213, 214; and the third electrical interconnect 215. Alternatively, the comparatively thin layer (e.g., 0.1 µm or less) of a known dielectric material can be provided over the thermally conductive and electrically insulating layer 217.

In accordance with a representative embodiment, the thermally conductive and electrically insulating layer 217 comprises aluminum nitride (AlN). Illustratively, the AlN is a polycrystalline AlN, which is sometimes referred to as "highly-textured" AlN. Alternatively, the thermally conductive and electrically insulating layer 217 may comprise other materials having an improved thermal conductivity compared to known passivation layers used in semiconductor applications. Contemplated materials include, but are not limited to diamond-like carbon (DLC), or boron nitride (BN), or silicon carbide (SiC), which are formed by known methods.

In accordance with representative embodiments described herein, the thickness of the thermally conductive and electrically insulating layer 217 comprising AlN is in the range of approximately 0.1 µm to approximately 2 µm.

As noted above, the thermally conductive and electrically insulating layer 217 has an improved thermal conductivity compared to known materials used for passivation in semiconductor structures. As described in connection with Table 1, when the thermally conductive and electrically insulating layer 217 is AlN, the greater the crystallinity of the AlN material, and the higher the thermal conductivity. For example, the thermal conductivity of single-crystal AlN is approximately 319 W/m-K. As such, while the thermal conductivity (70 W/m-K) of AlN nitride that is substantially amorphous is over twice that of SiN, which is commonly used for the passivation layer of many known semiconductor structures, it is clearly beneficial to form the thermally conductive and electrically insulating layer 217 comprising AlN having defined crystalline structures, such as a polycrystalline (highly textured) AlN, which exhibits a thermal conductivity (210 W/m-K) that is more than six (6) times that of SiN.

Like the thermally conductive and electrically insulating layer 118, the thermally conductive and electrically insulating layer 217 is provided over the subcollector layer 201 and substantially surrounds the exposed portions of: the collector layer 202; the base layer 203; and first and second emitter layers 204, 205. The thermally conductive and electrically insulating layer 217 may also substantially surround first and second collector contacts 206, 207; first, second and third base contacts 208, 209 and 210; first and second electrical interconnects 213, 214; and a portion of third electrical interconnect 215. As such, the thermally conductive and electrically insulating layer 217 is illustratively disposed over exposed sidewalls 219 of the collector layer 202. By selecting a material having a comparatively high thermal conductivity, such as AlN, and providing the thermally conductive and electrically insulating layer 217 over various exposed portions of the components of the front-end of the semiconductor structure, improvements in heat dissipation are realized compared to known semiconductor structures. For example, by providing the thermally conductive and electrically insulating layer 217 the over the exposed portions of the base layer 203 and the first and second emitter layers 204, 205, and thus the entire "emitter-base region," the thermally conductive and electrically insulating layer 217 acts as a thermal equalization layer for the regions around the base layer 203 and the first and second emitter layers 204, 205 of the semiconductor structure 200. Among other benefits, this fosters thermal equilibrium of the junction temperature of the emitter-base junction(s) of the semiconductor structure 200, which makes the device more resistant to failure due to thermal runaway. Moreover, the thermally conductive and electrically insulating layer 217 provided over the sidewalls 219 of the collector layer acts as a thermal equalization layer between the emitter-base mesa and first and second collector contacts 206, 207, promoting lateral (x-direction of the coordinate system of FIG. 2) thermal transport. Beneficially, this fosters thermal equilibrium between the emitter-base mesa and first and second collector contacts 206, 207. Furthermore, extending the thermally conductive and electrically insulating layer 217 over exposed sidewalls 120 of the base layer 203 also fosters thermal equilibrium of the junction temperature of the emitter-base junction(s) of the semiconductor structure 200, and improves the overall heat transport from the various layers that comprise the active device (in this case HBT).

As alluded to above, by using a material having a comparatively high thermal conductivity for the thermally conductive and electrically insulating layer 217, a shift in the tradeoff between extrinsic capacitance and heat conduction to a new and more favorable point compared to known semiconductor structures is realized. In particular, because the thermal resistance increases with increased thickness of a material, by selecting a comparatively thin (i.e., having a thickness substantially the same as that of a known passivation layer, such as SiN) thermally conductive and electrically insulating layer 217 comprising a material having a comparatively high thermal conductivity, the thermal conductivity is substantially improved, allowing for improved heat dissipation on the front-end of the semiconductor structure 200. In this example, therefore, although the parasitic capacitance is substantially the same as in the known semiconductor structure, the heat dissipation in semiconductor structure 200 is greatly improved. Alternatively, the thickness of the thermally conductive and electrically insulating layer 217 comprising a material having a comparatively high thermal conductivity could be deposited at a thickness that is great compared to that of a known passivation layer, such as SiN. As can be appreciated, this would increase the thermal resistance, but reduce the parasitic capacitance. In this example, therefore, although the heat dissipation in the front-end of the semiconductor structure 200 is substantially the same as that of a known semiconductor structure, the parasitic capacitance is substantially reduced.

Figure 3A:
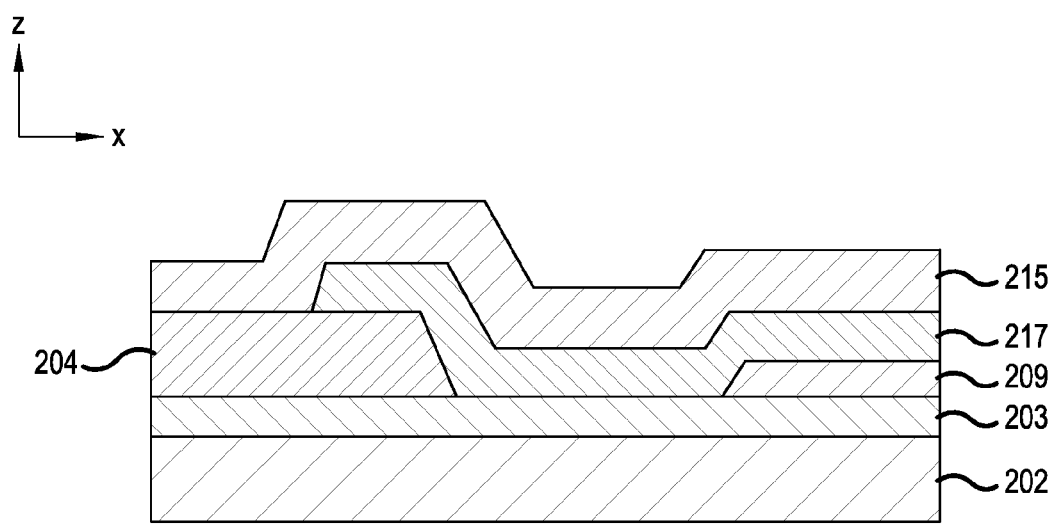
FIG. 3A shows a cross-sectional view of a portion of a semiconductor structure in accordance with a representative embodiment.
Figure 3B:
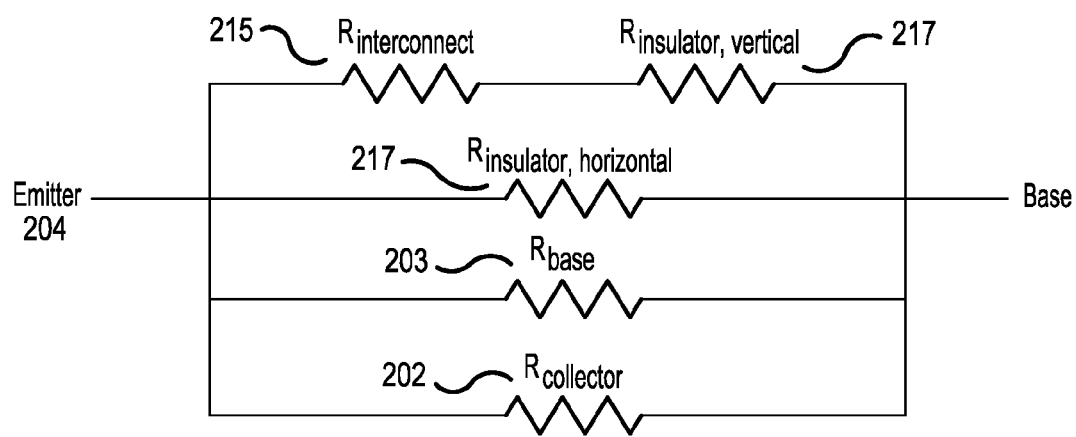
FIG. 3B depicts a simplified equivalent thermal resistance path of a semiconductor structure of a representative embodiment.

FIG. 3A shows a cross-sectional view of a portion of semiconductor structure 200 in accordance with a representative embodiment. Specifically, the portion of the structure depicts the emitter-region between the first emitter layer 204 and the second base contact 209. FIG. 3B depicts a simplified equivalent thermal resistance path of the portion of the semiconductor structure 200 depicted in FIG. 3A. Notably, the thermal resistance between the first emitter layer 204 and the second base contact 209 is approximated by the parallel combination of: the thermal resistance of the interconnect ($R_{interconnect}$) in series with the thermal resistance of the vertical path (z-direction of the coordinate system of FIGS. 2, 3A) of the thermal resistance of the thermally conductive and electrically insulating layer 217 ($R_{insulator,\,vertical}$); the thermal resistance in the vertical path (z-direction of the coordinate system of FIGS. 2, 3A) of the thermally conductive and electrically insulating layer 217 ($R_{insulator,\,horizontal}$); the thermal resistance of the base layer 203 ($R_{base}$); and the thermal resistance of the first emitter layer 204 ($R_{emitter}$). Notably, even if the third electrical interconnect 215 does not overlap the second base contact 209, the present teachings provide a clear improvement in heat dissipation compared to known semiconductor structures, because the thermally conductive and electrically insulating layer 217 transports heat laterally (x-direction of the coordinate system of FIGS. 2, 3A) between the first emitter layer 204 and the second base contact 209 much more efficiently than in known semiconductor structures.

By comparison with a known passivation layer (illustratively SiN dielectric) disposed over the emitter-base region of a known semiconductor device that is coupled with a parallel sheet of conductive metal (illustratively gold), the thermal conductivity between the first emitter layer 204 and the second base contact 209 is improved by a factor of approximately two (2) to approximately (3). Specifically, the approximate overall thermal resistance between the first emitter layer 204 and the second base contact 209 is at least a factor of two (2) better for the same region of known semiconductors, even when very thin passivation layers are implemented in the known structures. For practical implementations where the minimum thickness of the passivation layer (e.g., SiN) of known semiconductor structures need to be at least 0.1 µm to avoid shorting and unacceptable capacitance issues. When compared to such structures, the improvement in the approximate overall thermal resistance between the first emitter layer 204 and the second base contact 209 is generally greater than twice that of the known semiconductor structure. For higher thicknesses where minimization of extrinsic capacitance is desired (e.g., a passivation layer (SiN) having a thickness of at least 0.5 µm), the improvement in the approximate overall thermal resistance between the first emitter layer 204 and the second base contact 209 is nearly three (3) compared to the known semiconductor structure.

Figure 4:
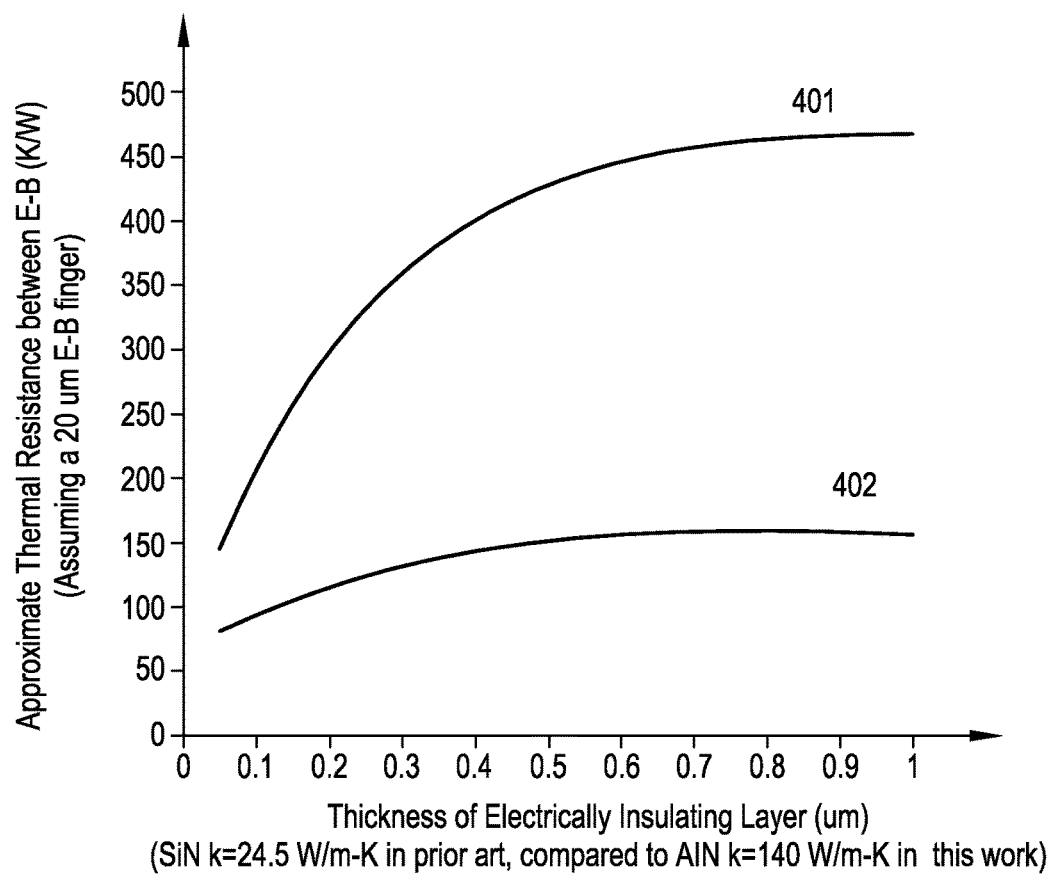
FIG. 4 is a graphical representation of thermal resistance versus substrate thickness of a known semiconductor structure and semiconductor structures of representative embodiments.

This is most clearly seen in FIG. 4. FIG. 4 is a graphical representation of thermal resistance versus thickness of a dielectric layer disposed over a front-end of a known semiconductor structure and the thermal resistance versus thickness of a thermally conductive and electrically insulative layer disposed over a front-end of semiconductor structures of representative embodiments.

Notably, each emitter-base pair has a length of approximately 20 µm long emitter-base pair, 1 µm pitch between the emitter and base contacts, a 2 µm thick interconnect layer, and thermal transport through the first 1 µm of the collector region.

As can be seen in FIG. 4, curve 401 depicts the thermal resistance versus dielectric thickness of a portion of a known semiconductor structure; whereas curve 403 depicts the thermal resistance of the portion of semiconductor structure 100 depicted in FIG. 3A. Plainly, the thermal conductivity of curve 402 is improved by a factor of approximately two (2) to approximately (3) compared to curve 401. As described above, this improvement is a direct result of the thermally conductive and electrically insulating layers 118, 217, which improves both of the elements ($R_{insulator,\,vertical}$ and $R_{insulator,\,horizontal}$).

Figure 5:
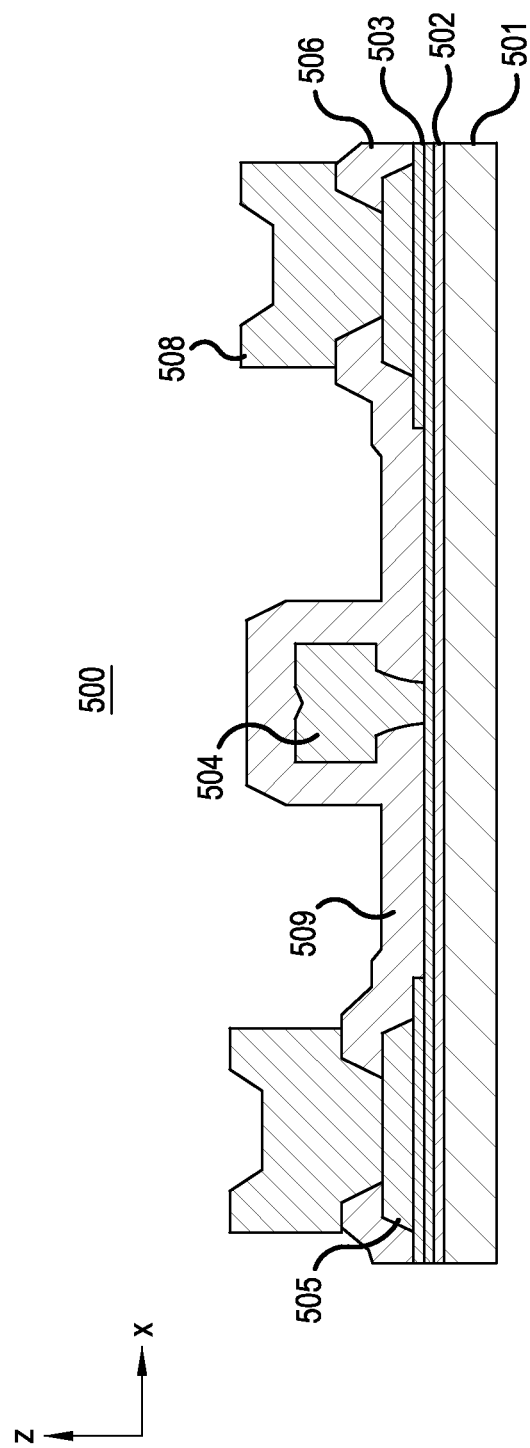
FIG. 5 a shows a cross-sectional view of a portion of a semiconductor structure in accordance with a representative embodiment.

FIG. 5 shows a cross-sectional view of a portion of a semiconductor structure 500 in accordance with a representative embodiment. Many aspects and details of the semiconductor structure 500, which include illustrative materials, structures, methods of fabrication and dimensions, are substantively identical to those described above in connection with the description of semiconductor structures 100, 200 presented above. Often, these common aspects and details are not repeated in order to avoid obscuring the presently described representative embodiments.

In the depicted representative embodiment, the semiconductor structure 500 illustratively comprises power transistors and power amplifiers that are contemplated for use in radio frequency (RF), microwave and millimeter wave applications. In a representative embodiment, the semiconductor structure 500 comprises metal-semiconductor field effect transistors (MESFETs), or other junction gate field effect transistors (JFETs) known to those of ordinary skill in the art.

In accordance with certain representative embodiments, the semiconductor devices of semiconductor structure 500 comprise binary semiconductor materials including Group III-V semiconductor materials, such as GaAs, InP, AlAs, GaN, AlN, InN, and alloys of these semiconductor materials. Alternatively, the semiconductor structure 200 comprises semiconductor devices made of Group IV semiconductor materials, ternary semiconductor materials, silicon (Si), silicon-germanium (SiGe), and alloys of some of these semiconductor materials. Essentially, and as will become clearer as the present description continues, the present teachings are contemplated for use when it is beneficial to remove heat generated by the various components of the semiconductor structure 200 with improved efficiency compared to known semiconductor structures. As such, and more generally, the present teachings are applicable more broadly to a variety of electronic and optoelectronic devices.

The semiconductor structure 500 comprises a substrate 501, which is illustratively semi-insulating. A conductive channel is disposed over the substrate 501, and semiconductor layers 503 formed thereover. As known to one of ordinary skill in the art, the semiconductor layers 503 are selectively doped to form the gate, source and drain regions of the semiconductor device (e.g., MESFET, JFET). A gate contact 504 is provided over a gate region of the semiconductor layers 503 and forms a Shottky barrier therewith. An ohmic source contact ("source contact") 505 is disposed over a source region of the semiconductor layers 503, and an ohmic drain contact ("drain contact") 506 is disposed over a drain region of the semiconductor layers 503. The semiconductor layers 503, and the gate, source and drain regions are formed using known materials and methods, including selective doping and epitaxial growth techniques.

A thermally conductive and electrically insulating layer 508 is disposed over the front-end of the semiconductor structure 500. In accordance with a representative embodiment, the thermally conductive and electrically insulating layer 508 comprises aluminum nitride (AlN). Illustratively, the AlN is a polycrystalline AlN, which is sometimes referred to as "highly-textured" AlN. Alternatively, the thermally conductive and electrically insulating layer 508 may comprise other materials having an improved thermal conductivity compared to known passivation layers used in semiconductor applications. Contemplated materials include, but are not limited to diamond-like carbon (DLC), or boron nitride (BN), or silicon carbide (SiC), which are formed by known methods.

In accordance with representative embodiments described herein, the thickness of the thermally conductive and electrically insulating layer 508 comprising AlN is in the range of approximately 0.1 μm to approximately 1.0 μm.

As noted above, the thermally conductive and electrically insulating layer 508 has an improved thermal conductivity compared to known materials used for passivation in semiconductor structures. As described in connection with Table 1, when the thermally conductive and electrically insulating layer 508 is AlN, the greater the crystallinity of the AlN material, the higher the thermal conductivity. For example, the thermal conductivity of single-crystal AlN is approximately 319 W/m-K. As such, while the thermal conductivity (70 W/m-K) of AlN nitride that is substantially amorphous is over twice that of SiN, which is commonly used for the passivation layer of many known semiconductor structures, it is clearly beneficial to form the thermally conductive and electrically insulating layer 508 comprising AlN having defined crystalline structures, such as a polycrystalline (highly textured) AlN, which exhibits a thermal conductivity (210 W/m-K) that is more that six (6) times that of SiN.

Like the thermally conductive and electrically insulating layer 118, the thermally conductive and electrically insulating layer 508 is provided over exposed portions of the various components of the front-end of the semiconductor structure 500. Notably, the thermally conductive and electrically insulating layer 508 is provided over the exposed portions of the semiconductor layers 503, the gate contact 504, the source contact 505, and the drain contact 506.

Like semiconductor structures 100, 200, by using a material having a comparatively high thermal conductivity for the thermally conductive and electrically insulating layer 508 in semiconductor structure 500, a shift in the tradeoff between extrinsic capacitance and heat conduction to a new and more favorable point compared to known semiconductor structures is realized. In particular, because the thermal resistance increases with increased thickness of a material, by selecting a comparatively thin (i.e., having a thickness substantially the same as that of a known passivation layer, such as SiN) thermally conductive and electrically insulating layer 508 comprising a material having a comparatively high thermal conductivity, the thermal conductivity is substantially improved, allowing for improved heat dissipation on the front-end of the semiconductor structure 500. In this example, therefore, although the parasitic capacitance is substantially the same as in the known semiconductor structure, the heat dissipation in semiconductor structure 500 is greatly improved. Alternatively, the thickness of the thermally conductive and electrically insulating layer 508 comprising a material having a comparatively high thermal conductivity could be deposited at a thickness that is great compared to that of a known passivation layer, such as SiN. As can be appreciated, this would increase the thermal resistance, but reduce the parasitic capacitance. In this example, therefore, although the heat dissipation in the front-end of the semiconductor structure 200 is substantially the same as that of a known semiconductor structure, the parasitic capacitance is substantially reduced.

In view of this disclosure it is noted that the various semiconductor structures can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

What is claimed:

1. A semiconductor structure, comprising: a base layer disposed over a side of a substrate; a base electrical contact disposed over the base layer; an emitter electrical contact disposed over the side of the substrate; an emitter layer disposed beneath the emitter electrical contact; wherein the emitter layer is in direct contact with the emitter electrical contact; a collector layer disposed beneath the base layer; a collector electrical contact disposed over the collector layer, the emitter electrical contact, the base electrical contact, arid the collector electrical contact being disposed over the side of the substrate, wherein a heterojunction exists across the emitter layer, the base layer and the collector layer; and a thermally conductive and electrically insulating layer disposed over a portion of the layer and between the base electrical contact and the second-emitter electrical contact, the thermally conductive and electrically insulating layer comprising one of: highly-textured aluminum nitride (AlN), or boron nitride (BN).

2. A semiconductor structure as claimed in claim 1, wherein the thermally conductive and electrically insulating layer has a thermal conductivity in a range of approximately 70 W/m-K and approximately 319 W/m-K.

3. A semiconductor structure as claimed in claim 1, wherein the thermally conductive and electrically insulating layer is disposed over the base electrical contact.

4. A semiconductor structure as claimed in claim 1, wherein the emitter layer is a first emitter layer, the emitter electrical contact is a first emitter contact, the base electrical contact is a first base contact, and the semiconductor structure further comprises:

a second base contact; and a second emitter layer disposed beneath a second emitter contact, the thermally conductive and electrically insulating layer being disposed over a portion of the second emitter layer and between the second emitter contact and the second base contact.

5. A semiconductor structure as claimed in claim 4, wherein the thermally conductive and electrically insulating layer is disposed over each of the first base contact and the second base contact.

6. A semiconductor structure as claimed in claim 4, further comprising:

an electrically conductive interconnect disposed over the first and second emitter contact, and in electrical contact with the first and second emitter contact and the electrically conductive interconnect, wherein the thermally conductive and electrically insulative layer is disposed between the electrically conductive interconnect and the first and second emitter contacts.

7. An semiconductor structure as claimed in claim 1, wherein the emitter layer, the base layer and the collector layer comprise one or more of gallium arsenide (GaAs), indium phosphide (InP), aluminum arsenide (AlAs), or alloys of GaAs, InP, AlAs.

8. A semiconductor structure as claimed in claim 1, wherein the semiconductor structure comprises one or more of a metal-semiconductor field effect transistor (MESFET), a high electron mobility transistor (HEMT), a pseudomorphic HEMT, a junction field effect transistor (JFET), and a heterojunction bipolar transistor (HBT).

9. A semiconductor structure as claimed in claim 1, further comprising:

a dielectric layer disposed over the thermally conductive and electrically insulative layer, wherein the thermally conductive and electrically insulative layer is a first thermally conductive and electrically insulative layer; and a second thermally conductive and electrically insulative layer disposed over the dielectric layer.

10. A semiconductor structure as claimed in claim 9, wherein the dielectric layer comprises a stack of dielectric layers.

11. A semiconductor structure as claimed in claim 1, wherein the thermally conductive and electrically insulating layer is disposed over an upper surface of the base electrical contact.

12. A semiconductor structure as claimed in claim 1, wherein the thermally conductive and electrically insulating layer does not comprise either silicon oxide or silicon nitride.

13. A semiconductor structure as claimed in claim 1, wherein a thermal resistance of the emitter layer and the base electrical contact comprises a parallel combination of:

a thermal resistance of an interconnect to the semiconductor structure in series with a thermal resistance of a vertical path of a thermal resistance of the thermally conductive and electrically insulating layer; a thermal resistance in the vertical path of the thermally conductive and electrically insulating layer; a thermal resistance of the base layer; and a thermal resistance of the emitter layer.

14. A semiconductor structure, comprising: a collector layer disposed over a substrate, the collector layer having sidewalls; a base layer disposed over the collector layer; an emitter layer disposed over the base layer; the base layer, the emitter layer, and the collector layer providing a heterojunction; an emitter electrical contact disposed over and in direct contact with the emitter layer; a base electrical contact disposed over the base layer; a collector electrical contact disposed over the collector layer, the emitter electrical contact, the base electrical contact, arid the collector electrical contact being disposed over a same side of the substrate; and a thermally conductive and electrically insulating layer disposed over a portion of the base layer, between the emitter electrical contact and the base electrical contact, and along the sidewalls of the collector layer, the thermally conductive and electrically insulating layer comprising one of: highly-textured aluminum nitride (AlN), or boron nitride (BN).

15. A semiconductor structure as claimed in claim 14, wherein the thermally conductive and electrically insulating layer substantially surrounds exposed portions of the base layer.

16. A semiconductor structure as claimed in claim 14, wherein the thermally conductive and electrically insulating layer substantially surrounds exposed portions of the emitter layer.

17. A semiconductor structure as claimed in claim 14, wherein the thermally conductive and electrically insulating layer has a thermal conductivity in a range of approximately 70 W/m-K and approximately 319 W/m-K.

18. A semiconductor structure as claimed in claim 14, wherein the emitter layer is a first emitter layer, the emitter electrical contact is a first emitter contact, the base electrical contact is a first base contact, and the semiconductor structure further comprises:

a second base contact; and a second emitter layer disposed beneath a second emitter contact, the thermally conductive and electrically insulating layer being disposed over a portion of the second emitter layer and between the second emitter contact and the second base contact.

19. A semiconductor structure as claimed in claim 18, further comprising:

an electrically conductive interconnect disposed over the first and second emitter contacts, the electrically conductive interconnect comprising electrical contacts in electrical contact with the first and second emitter contacts, wherein the thermally conductive and electrically insulative layer is disposed between the electrically conductive interconnect and the first and second emitter contact, and along portions of the electrical contacts.

20. A semiconductor structure as claimed in claim 19, wherein the thermally conductive and electrically insulating layer substantially surrounds exposed portions of the first and second emitter layers.

21. An semiconductor structure as claimed in claim 14, wherein the emitter layer, the base layer and the collector layer comprise one or more of gallium arsenide (GaAs), indium phosphide (InP), aluminum arsenide (AlAs), or alloys of GaAs, InP, AlAs.

22. A semiconductor structure as claimed in claim 14, wherein the thermally conductive and electrically insulating layer is disposed over an upper surface of the base electrical contact.

23. A semiconductor structure as claimed in claim 14, wherein the thermally conductive and electrically insulating layer does not comprise either silicon oxide or silicon nitride.

24. A semiconductor structure as claimed in claim 14, wherein a thermal resistance of the emitter layer and the base electrical contact comprises a parallel combination of:

a thermal resistance of an interconnect to the semiconductor structure in series with a thermal resistance of a vertical path of a thermal resistance of the thermally conductive and electrically insulating layer; a thermal resistance in the vertical path of the thermally conductive and electrically insulating layer; a thermal resistance of the base layer; and a thermal resistance of the emitter layer.

* * * * *